(12) United States Patent
Das et al.

(10) Patent No.: US 12,046,998 B2
(45) Date of Patent: Jul. 23, 2024

(54) HIGH SPEED, EFFICIENT SiC POWER MODULE

(71) Applicant: Wolfspeed, Inc., Durham, NC (US)

(72) Inventors: Mrinal K. Das, Morrisville, NC (US); Adam Barkley, Durham, NC (US); Henry Lin, Chapel Hill, NC (US); Marcelo Schupbach, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 854 days.

(21) Appl. No.: 16/784,857

(22) Filed: Feb. 7, 2020

(65) Prior Publication Data
US 2020/0177079 A1   Jun. 4, 2020

Related U.S. Application Data

(63) Continuation of application No. 15/055,872, filed on Feb. 29, 2016, now Pat. No. 10,680,518.
(Continued)

(51) Int. Cl.
*H02M 3/155* (2006.01)
*H01L 23/373* (2006.01)
(Continued)

(52) U.S. Cl.
CPC ........ *H02M 3/155* (2013.01); *H01L 23/3735* (2013.01); *H01L 25/072* (2013.01);
(Continued)

(58) Field of Classification Search
CPC ...... H02M 3/003; H02M 7/003; H02M 3/155; H01L 25/112
See application file for complete search history.

(56) References Cited

U.S. PATENT DOCUMENTS 10,224,810 B2 * 3/2019 Barkley ............... H05K 5/0256
2004/0212074 A1 10/2004 Divakar et al.
(Continued)

FOREIGN PATENT DOCUMENTS

| JP | 2009158533 A | 7/2009 |
|---|---|---|
| WO | 2013171136 A1 | 11/2013 |
| WO | 2014186448 A1 | 11/2014 |

OTHER PUBLICATIONS

Chen et al.,An Ultra-Fast SiC Phase-Leg Module in Modified Hybrid Packaging Structure . . . ,Sep. 1, 2014, 2014 IEEE-ECCE, 2880-2886 (Year: 2014).*
(Continued)

*Primary Examiner* — Jue Zhang
(74) *Attorney, Agent, or Firm* — BakerHostetler

(57) ABSTRACT

A power converter module includes an active metal braze (AMB) substrate, power converter circuitry, and a housing. The AMB substrate includes an aluminum nitride base layer, a first conductive layer on a first surface of the aluminum nitride base layer, and a second conductive layer on a second surface of the aluminum nitride base layer opposite the first surface. The power converter circuitry includes a number of silicon carbide switching components coupled to one another via the first conductive layer. The housing is over the power converter circuitry and the AMB substrate. By using an AMB substrate with an aluminum nitride base layer, the thermal dissipation characteristics of the power converter module may be substantially improved while maintaining the structural integrity of the power converter module.

22 Claims, 8 Drawing Sheets

Related U.S. Application Data

(60) Provisional application No. 62/133,872, filed on Mar. 16, 2015.

(51) Int. Cl.
  *H01L 25/07*    (2006.01)
  *H01L 29/16*    (2006.01)
  *H02M 3/00*    (2006.01)
  *H05K 3/30*    (2006.01)
  *H02M 1/00*    (2006.01)
  *H02M 1/08*    (2006.01)
  *H02M 1/34*    (2007.01)
  *H02M 1/44*    (2007.01)
  *H02M 7/00*    (2006.01)

(52) U.S. Cl.
  CPC ........ *H01L 29/1608* (2013.01); *H02M 3/003* (2021.05); *H05K 3/303* (2013.01); *B60L 2210/00* (2013.01); *H01L 2224/0603* (2013.01); *H01L 2224/4903* (2013.01); *H01L 2224/49111* (2013.01); *H01L 2224/49431* (2013.01); *H02M 1/0054* (2021.05); *H02M 1/08* (2013.01); *H02M 1/348* (2021.05); *H02M 1/44* (2013.01); *H02M 7/003* (2013.01); *Y02B 70/10* (2013.01)

(56) References Cited

U.S. PATENT DOCUMENTS

| | | | |
|---|---|---|---|
| 2006/0108684 A1* | 5/2006 | Stevanovic | H01L 25/072 257/E25.015 |
| 2008/0023825 A1 | 1/2008 | Hebert et al. | |
| 2008/0054439 A1 | 3/2008 | Malhan et al. | |
| 2008/0180974 A1* | 7/2008 | Shiraishi | H01L 29/66689 257/E29.256 |
| 2009/0283309 A1 | 11/2009 | Naba et al. | |
| 2010/0157608 A1 | 6/2010 | Chen et al. | |
| 2011/0169549 A1 | 7/2011 | Wu | |
| 2011/0210708 A1 | 9/2011 | Herbsommer et al. | |
| 2013/0020672 A1 | 1/2013 | Tipton et al. | |
| 2013/0207123 A1 | 8/2013 | Henning et al. | |
| 2013/0248883 A1 | 9/2013 | Das et al. | |
| 2014/0070627 A1 | 3/2014 | Briere et al. | |
| 2014/0138707 A1 | 5/2014 | Miki et al. | |
| 2014/0246681 A1 | 9/2014 | Das et al. | |
| 2015/0130071 A1 | 5/2015 | Hohlfeld et al. | |
| 2015/0131236 A1 | 5/2015 | Passmore et al. | |
| 2016/0276927 A1 | 9/2016 | Das et al. | |
| 2016/0308523 A1* | 10/2016 | Otake | H01L 29/7805 |
| 2017/0040890 A1 | 2/2017 | Barkley et al. | |
| 2017/0213811 A1 | 7/2017 | Das et al. | |

OTHER PUBLICATIONS

Kim et al., Practical implementation of a silicon carbide-based 300 kHz, 1.2 KW hard-switching boost-converter . . . , Mar. 1, 2015, IET, 333-341 (Year: 2015).*
Non-Final Office Action for U.S. Appl. No. 15/055,872, mailed Mar. 26, 2018, 17 pages.
Final Office Action for U.S. Appl. No. 15/055,872, mailed Oct. 2, 2018, 17 pages.
Advisory Action for U.S. Appl. No. 15/055,872, mailed Feb. 8, 2019, 3 pages.
Non-Final Office Action for U.S. Appl. No. 15/055,872, mailed Mar. 21, 2019, 20 pages.
Notice of Allowance for U.S. Appl. No. 15/055,872, mailed Oct. 30, 2019, 9 pages.
Notice of Allowance for U.S. Appl. No. 15/055,872, mailed Mar. 25, 2020, 9 pages.
Notice of Allowance for U.S. Appl. No. 15/295,599, mailed Nov. 6, 2018, 9 pages.
First Office Action for Chinese Patent Application No. 2016800250818, mailed Dec. 6, 2019, 23 pages.
Office Action for German Patent Application No. 11 2016 001 261.6, mailed Dec. 12, 2019, 9 pages.
Invitation to Pay Additional Fees and Partial International Search for International Patent Application No. PCT/ US2016/022031, mailed Jun. 22, 2016, 6 pages.
International Search Report and Written Opinion for International Patent Application No. PCT/US2016/022031, mailed Aug. 16, 2016, 15 pages.
International Preliminary Report on Patentability for International Patent Application No. PCT/US2016/022031, mailed Sep. 28, 2017, 10 pages.
Wang et al.; "10-kV SiC MOSFET-Based Boost Converter"; IEEE Transactions on Industry Applications; vol. 45 No. 6; Nov./Dec. 2009; p. 2056-2063.

* cited by examiner

HIGH SPEED, EFFICIENT SiC POWER MODULE

RELATED APPLICATIONS

This application is a continuation of U.S. patent application Ser. No. 15/055,872, filed on Feb. 29, 2016, which claims the benefit of U.S. provisional patent application No. 62/133,872, filed Mar. 16, 2015, the disclosures of which are incorporated herein by reference in their entireties.

FIELD OF THE DISCLOSURE

The present disclosure relates to power converter modules, and specifically to high-frequency power converter modules utilizing silicon carbide (SiC) components.

BACKGROUND

Power converter modules (which, as referred to herein may also include power inverter modules) are standalone devices that may perform a variety of functions within a power converter system. For example, power converter modules may include boost converters, buck converters, half-bridge converters, and full-bridge converters. Conventional power converter modules generally include power converter circuitry utilizing silicon (Si) switching components. While effective in many applications, using power converter circuitry with silicon (Si) switching components generally limits the switching frequency at which the power converter circuitry can operate. The lower the switching frequency of the components in the power converter circuitry, the larger the filtering components such as inductors and capacitors utilized in a power converter system need to be. Accordingly, filtering components used along with power converter circuitry using silicon (Si) switching components must be quite large, thereby driving up the cost of the power converter system. Further, at high switching frequency, silicon (Si) switching components are often associated with relatively low efficiency and low power density.

SUMMARY

The present disclosure relates to power converter modules, and specifically to high-frequency power converter modules utilizing silicon carbide (SiC) components. In one embodiment, a power converter module includes an active metal braze (AMB) substrate, power converter circuitry, and a housing. The AMB substrate includes an aluminum nitride base layer, a first conductive layer on a first surface of the aluminum nitride base layer, and a second conductive layer on a second surface of the aluminum nitride base layer opposite the first surface. The power converter circuitry includes a number of silicon carbide switching components coupled to one another via the first conductive layer. The housing is over the power converter circuitry and the AMB substrate. By using an AMB substrate with an aluminum nitride base layer, the thermal dissipation characteristics of the power converter module may be substantially improved while maintaining the structural integrity of the power converter module.

In one embodiment, the first conductive layer is directly on the first surface of the aluminum nitride base layer and the second conductive layer is directly on the second surface of the aluminum nitride base layer.

In one embodiment, the first conductive layer is etched to form a desired connection pattern between the silicon carbide switching components. The silicon carbide switching components may be coupled to the first conductive layer via one or more wirebonds such that the power switching path has a maximum length of about 50 mm and the gate control path has a maximum length of about 20 mm. By minimizing the power switching path length and gate control path length, the stray inductance in the power converter module is reduced.

In one embodiment, the power converter circuitry is a boost converter configured to receive a direct current (DC) input voltage and provide a stepped-up DC output voltage. The power converter circuitry may include a silicon carbide metal-oxide-semiconductor field-effect transistor (MOSFET) coupled in series with a silicon carbide Schottky diode. Further, the power converter circuitry may be configured to provide an output voltage greater than 650V, an output power greater than 900 W, and operate at a switching frequency greater than 40 kHz. The switching losses of the power converter circuitry may be between 5 mJ/A and 100 mJ/A. The insulating base layer may have a minimum thermal conductivity of 30 W/m-K in order to provide low thermal resistance between the power converter circuitry and the second conductive layer.

In one embodiment, the power converter circuitry is one of a buck converter, a half-bridge converter, a full-bridge converter, a single-phase inverter, a three-phase inverter, and multilevel topologies like neutral point clamped (NPC) and transistor-type neutral point clamped (TNPC).

In one embodiment, a method for manufacturing a power converter module comprises providing an active metal braze (AMB) substrate, providing power converter circuitry, and providing a housing. The AMB substrate includes an aluminum nitride base layer, a first conductive layer on a first surface of the aluminum nitride base layer, and a second conductive layer on a second surface of the aluminum nitride base layer opposite the first surface. The power converter circuitry includes a number of silicon carbide switching components coupled to one another via the first conductive layer. The housing is provided over the power converter circuitry and the AMB substrate. By using an AMB substrate with an aluminum nitride base layer, the thermal dissipation characteristics of the power converter module may be substantially improved while maintaining the structural integrity of the power converter module.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
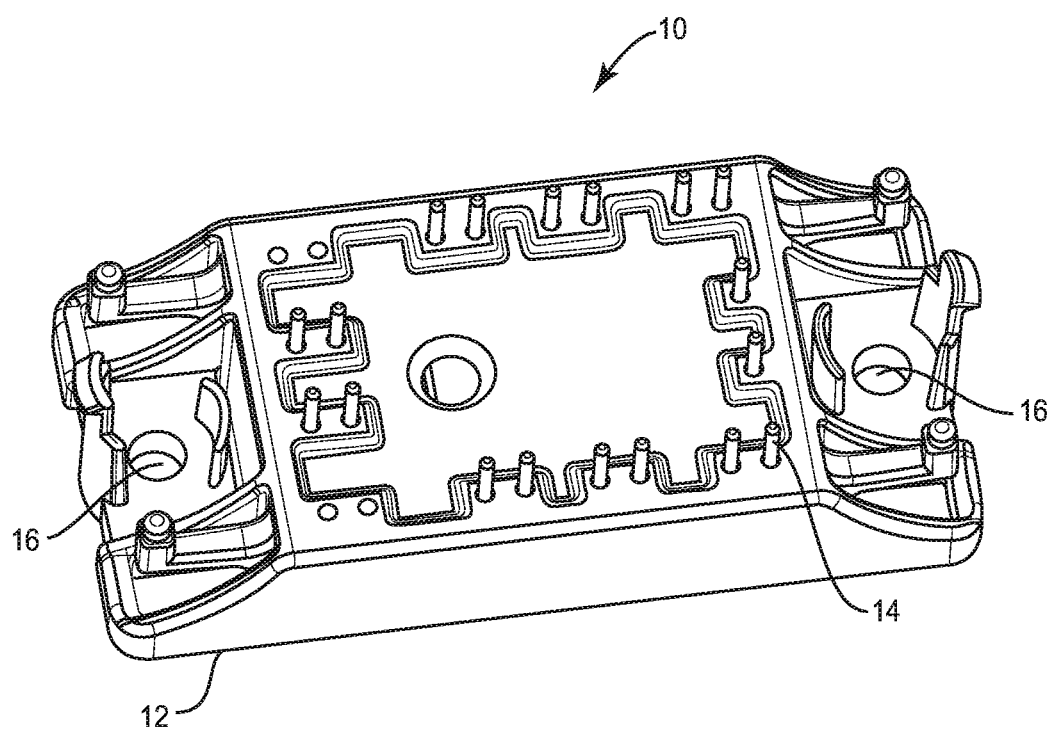
FIG. 1 is an isometric view of a power converter module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In light of the above, there is a need for power converter circuitry with improved performance. Specifically, there is a need for power converter circuitry capable of efficiently operating at high switching frequencies and high power densities.

Figure 2:
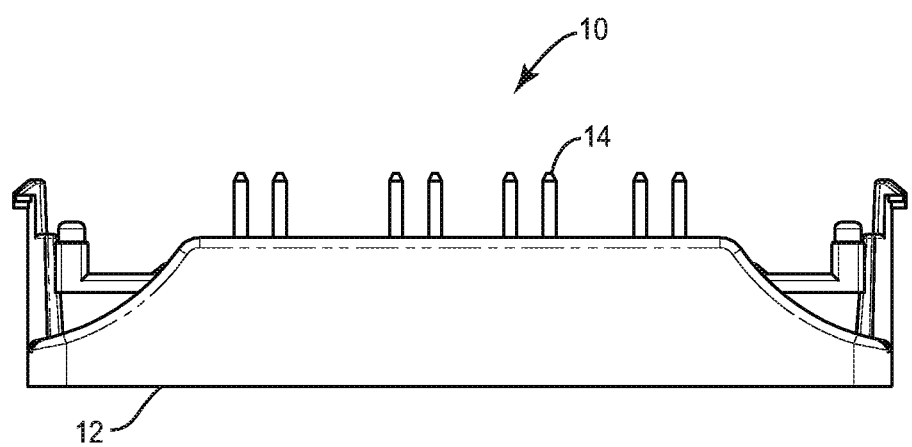
FIG. 2 is a side view of a power converter module according to one embodiment of the present disclosure.

FIGS. 1 and 2 show an isometric view and a side view, respectively, of a power converter module 10 according to one embodiment of the present disclosure. The power converter module 10 includes a housing 12, a number of input/output (I/O) pins 14, and a number of mounting holes 16. The housing 12 may be formed of a plastic material and have a footprint of approximately 31 mm×66 mm×16 mm such that the power converter module 10 is compatible with existing power converter systems that accept power converter modules of this size. Notably, the principles of the present disclosure may be applied to housings of any material type and size. The I/O pins 14 are coupled to various points in power converter circuitry (not shown) contained within the housing 12, as discussed in detail below.

Figure 3:
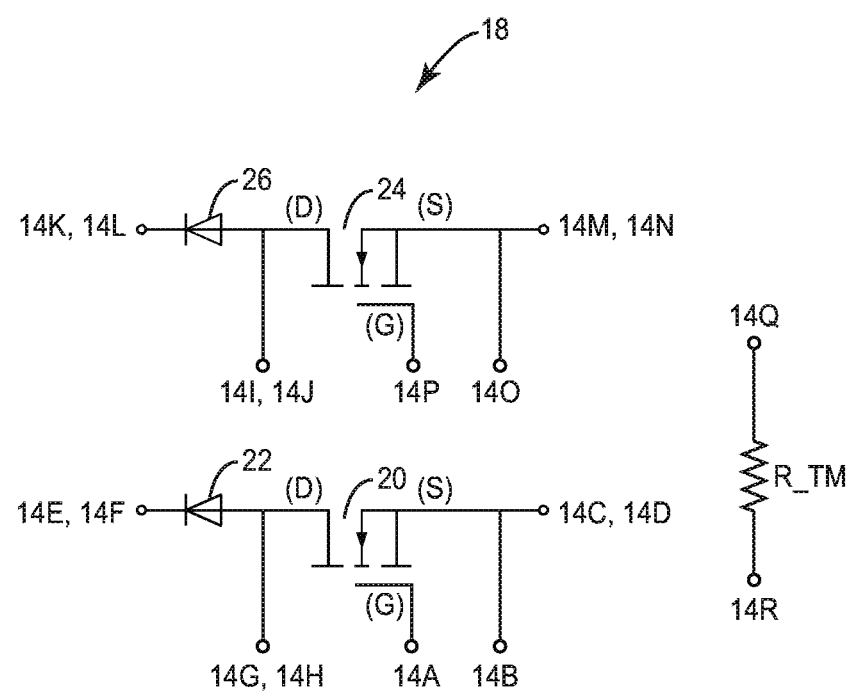
FIG. 3 is a schematic of power converter circuitry in a power converter module according to one embodiment of the present disclosure.

FIG. 3 is a schematic showing details of power converter circuitry 18 within the housing 12 of the power converter module 10 according to one embodiment of the present disclosure. The power converter circuitry 18 is divided into two parts (referred to herein as "channels"), and includes a first metal-oxide-semiconductor field-effect transistor (MOSFET) 20 coupled in series with a first diode 22 and a second MOSFET 24 coupled in series with a second diode 26. Specifically, the first MOSFET 20 includes a gate contact (G), a source contact (S), and a drain contact (D). The gate contact (G) of the first MOSFET 20 is coupled to a first one of the I/O pins 14A. The source contact (S) of the first MOSFET 20 is coupled to a second, a third, and a fourth one of the I/O pins 14B, 14C, and 14D. A cathode of the first diode 22 is coupled to a fifth and a sixth one of the I/O pins 14E and 14F. The drain contact (D) of the first MOSFET 20 is coupled to a ninth and a tenth one of the I/O pins 14G and 14H and to the anode of the first diode 22.

Similarly, the second MOSFET 24 includes a gate contact (G), a source contact (S), and a drain contact (D). The drain contact (D) of the second MOSFET 24 is coupled to an eleventh and a twelfth one of the I/O pins 14I and 14J and to the anode of the second diode 26. The cathode of the second diode 26 is coupled to a thirteenth and a fourteenth one of the I/O pins 14K and 14L. The source contact (S) of the second MOSFET 24 is coupled to a fifteenth, a sixteenth, and a seventeenth one of the I/O pins 14M, 14N, 14O. The gate contact (G) of the second MOSFET 24 is coupled to an eighteenth one of the I/O pins 14P. A temperature measurement resistor R_TM is coupled between a nineteenth and a twentieth one of the I/O pins 14Q and 14R.

The first MOSFET 20 and the first diode 22 (i.e., a first channel), along with one or more external components, form first boost converter circuitry, while the second MOSFET 24 and the second diode 26 (i.e., a second channel), along with one or more external components, form second boost converter circuitry. Because the separate boost converter circuitry operates in the same manner, the principles of operation thereof will now be discussed as they relate to the first boost converter circuitry. In operation, a direct current (DC) voltage is placed across the source contact (S) and the drain contact (D) of the first MOSFET 20. In some embodiments, the DC voltage delivered to the drain contact (D) of the first MOSFET 20 may be provided via a boost inductor (not shown). Further, a switching control signal is provided to the gate contact (G) of the first MOSFET 20, generally by gate driver circuitry (not shown). The resulting voltage across the cathode of the first diode 22 and the source contact (S) of the first MOSFET 20 is a stepped-up DC output voltage. Accordingly, the first boost converter circuitry and the second boost converter circuitry may be used to appropriately scale high-power DC voltages, which may be especially useful in applications such as solar power systems.

Notably, the first MOSFET 20 and the second MOSFET 24 each include a gate return terminal (I/O pin 14B and I/O pin 14O, respectively) coupled to the source contact (S) thereof. Notably, these gate return terminals are located as close to the first MOSFET 20 and the second MOSFET 24, respectively, as possible, such that a parasitic inductance between the gate return terminal and the source contact (S) is minimized. Generally, this increases the achievable turn-on and turn-off speed of the first MOSFET 20 and the second MOSFET 24, thereby improving the performance of the power converter circuitry 18 by reducing switching losses.

Any of the first MOSFET 20, the first diode 22, the second MOSFET 24, and the second diode 26 are silicon carbide devices, which may be referred to as switching devices. As discussed herein, switching devices are devices capable of selectively delivering power to a load. In one embodiment, the first diode 22 and the second diode 26 are Schottky diodes. Accordingly, the performance of the power converter module 10 may be significantly improved. Specifically, because silicon carbide devices are majority carrier devices, they do not suffer from reductions in switching speed due to recombination of minority carriers that produce tail or reverse recovery currents. In one embodiment, recovery currents in conventional silicon PiN diodes are on the order of ~7000 nC, while recovery currents in the power converter circuitry 18 are less than ~120 nC (>16× reduction). Accordingly, silicon carbide devices can be operated at much higher speeds than conventional silicon devices, which provides several performance benefits for the power converter module 10 discussed below. The first boost converter circuit and the second boost converter circuit may be referred to as "channels." Each one of these channels may provide an output voltage between 650V and 1200V, an output current from 10A to 50A (e.g., 10A, 20A, 30A, 40A, and 50A), and an output power between 900 W and 30 kW. Further, each one of these channels may provide an efficiency between about 96% and 99.5%, and switching losses less than or equal to about 300 W when operated at switching speeds greater than 40 kHz.

In addition to the performance benefits afforded by utilizing silicon carbide devices in the power converter module 10, using silicon carbide devices also provides cost savings. Specifically, the size of filtering components such as inductors and capacitors used in a power converter system in which the power converter module 10 is incorporated is inversely proportional to the switching frequency of the power converter module. Further, the size of filtering components is proportional to the cost thereof. Accordingly, by using silicon carbide switching components that may be operated at high frequencies such as those above 40 kHz, the size of filtering components in a power system can be drastically reduced, thereby saving cost.

While the power converter circuitry 18 shown in FIG. 3 is shown as a two-channel boost converter, the present disclosure is not so limited. The principles of the present disclosure may be applied to power converter circuitry 18 including a buck converter, a half-bridge converter, a full-bridge converter, a single-phase inverter, a three-phase inverter, or the like.

Figure 4:
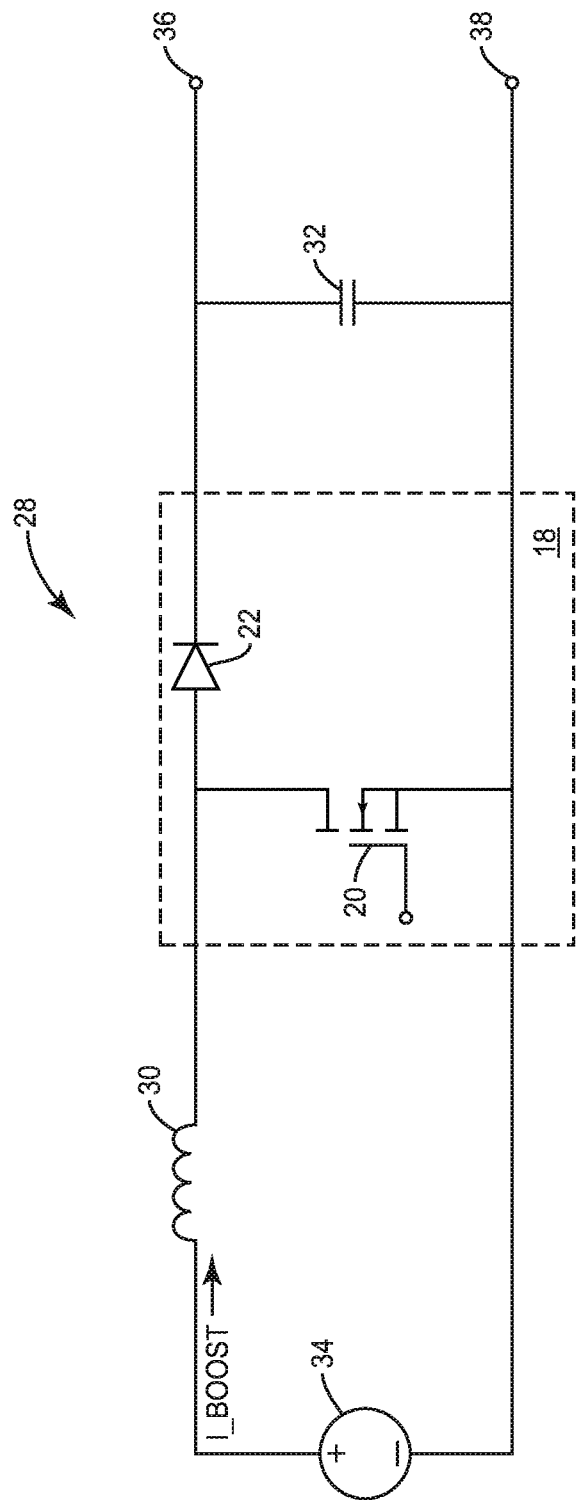
FIG. 4 is a schematic of a boost converter including power converter circuitry shown according to one embodiment of the present disclosure.

FIG. 4 shows boost converter circuitry 28 including a first channel of the power converter circuitry 18. The boost converter circuitry 28 includes the first MOSFET 20 and the first diode 22, a boost inductor 30, an output capacitor 32, and a voltage source 34. The boost inductor 30 is coupled between a positive output of the voltage source 34 and the drain contact (D) of the first MOSFET 20. A negative output of the voltage source 34 is coupled to the source contact (S) of the first MOSFET 20. The first diode 22 is coupled between the drain contact (D) of the first MOSFET 20 and a first load output 36 of the boost converter circuitry 28. A second load output 38 is coupled to the source contact (S) of the first MOSFET 20. The output capacitor 32 is coupled between the first load output 36 and the second load output 38.

In operation, a positive voltage from the voltage source 34 is delivered to the boost inductor 30, where energy can be stored as a magnetic field. A switching control signal is delivered to the gate contact (G) of the first MOSFET 20 in order to repeatedly switch the first MOSFET 20 between an off-state and an on-state. In the off-state of the first MOSFET 20, a positive potential across the first diode 22 due to a charge on the boost inductor 30 allows current from the boost inductor (I_BOOST) to flow to the first load output 36 and charge the output capacitor 32. While not shown, a load will be coupled between the first load output 36 and the second load output 38 to complete the circuit. In the on-state of the first MOSFET 20, the anode of the first diode 22 is shorted to ground, and a charge on the output capacitor 32 causes the first diode 22 to remain in a blocking mode of operation. Energy stored in the output capacitor 32 causes a current to continue to flow into the load (not shown).

Notably, the speed at which the first MOSFET 20 is able to transition between the off-state and the on-state determines many operational characteristics of the boost converter circuitry 28. Faster switching speeds allow the boost converter circuitry 28 to operate in a continuous conduction mode in which the current supplied by the boost inductor 30 in a single switching period is reduced. Generally, silicon devices cannot achieve speeds sufficient to operate in a continuous conduction mode, and instead must operate in a discontinuous conduction mode. The reduced current supply requirements afforded by switching the first MOSFET 20 at high speeds results in a reduced requirement for energy storage by the boost inductor 30, and reduced electromagnetic interference (EMI), which eases the design of electromagnetic filtering circuitry associated with the boost converter circuitry 28. Accordingly, the inductance of the boost converter can be reduced without affecting the performance of the boost converter circuitry 28. Generally, the inductance value of an inductor is proportional to the size thereof. Accordingly, the size of the boost inductor 30 can be reduced as well. Further, the inductance value and size of an inductor is proportional to the cost thereof. As the boost inductor 30 may be among the most expensive parts of the boost converter circuitry 28, it may be highly beneficial to utilize the high switching speed of the first MOSFET 20 in order to reduce these costs. In one embodiment, the inductance value of the boost inductor 30 may be less than 450 µH due to the switching speeds achievable by the first MOSFET 20 as discussed herein. For example, the inductance of the boost inductor 30 may be between 25 µH and 150 µH, may be between 150 µH and 300 µH, and may be between 300 µH and 450 µH. Further, the total volume of the boost inductor 30 may be less than 7 cubic inches (e.g., between 1 cubic inch and 3 cubic inches, between 3 cubic inches and 5 cubic inches, and between 5 cubic inches and 7 cubic inches) and the total weight of the boost inductor 30 may be less than 1 pound (e.g., between 0.1 pounds and 0.3 pounds, between 0.3 pounds and 0.6 pounds, and between 0.6 pounds and 0.9 pounds) in some embodiments.

Figure 5:
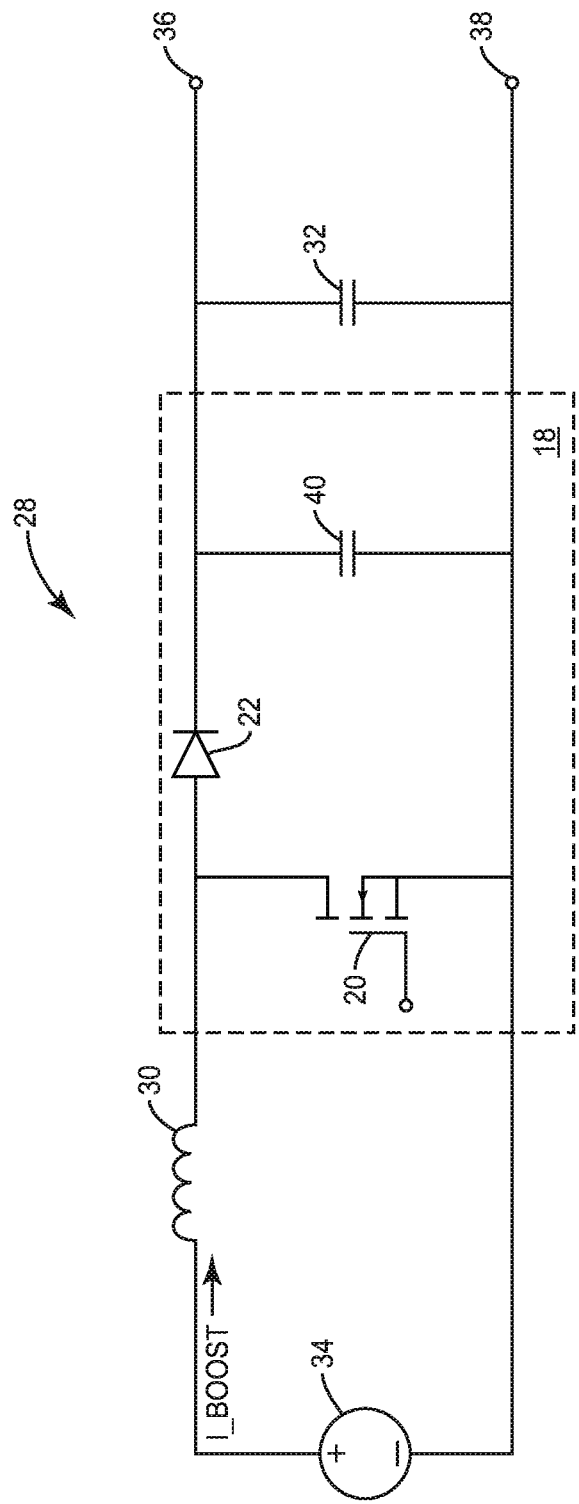
FIG. 5 is a schematic of a boost converter including power converter circuitry according to an additional embodiment of the present disclosure.

FIG. 5 shows the boost converter circuitry 28 according to an alternative embodiment of the present disclosure. The boost converter circuitry 28 shown in FIG. 5 is substantially similar to that shown in FIG. 4, except that the boost converter circuitry 28 shown in FIG. 5 includes an inner-loop capacitor 40 coupled between the first load output 36 and the second load output 38 (in parallel with the output capacitor 32). Notably, the inner-loop capacitor 40 is within the power converter circuitry 18 itself. Specifically, the inner-loop capacitor 40 closes the loop between the cathode of the first diode 22 and the source contact (S) of the first MOSFET 20 in as short a length as possible. This improves performance of the power converter circuitry 18 by reducing parasitic inductances and thus reducing ringing and other performance-reducing phenomena. In the embodiment shown in FIG. 5, the inner-loop capacitor 40 may be a high-frequency capacitor such as a ceramic capacitor, while the output capacitor 32 may be a relatively low-frequency capacitor such as an electrolytic capacitor or polymer film capacitor. However, the output capacitor 32 and the inner-loop capacitor 40 may be any type of capacitor without departing from the principles described herein.

Figure 6:
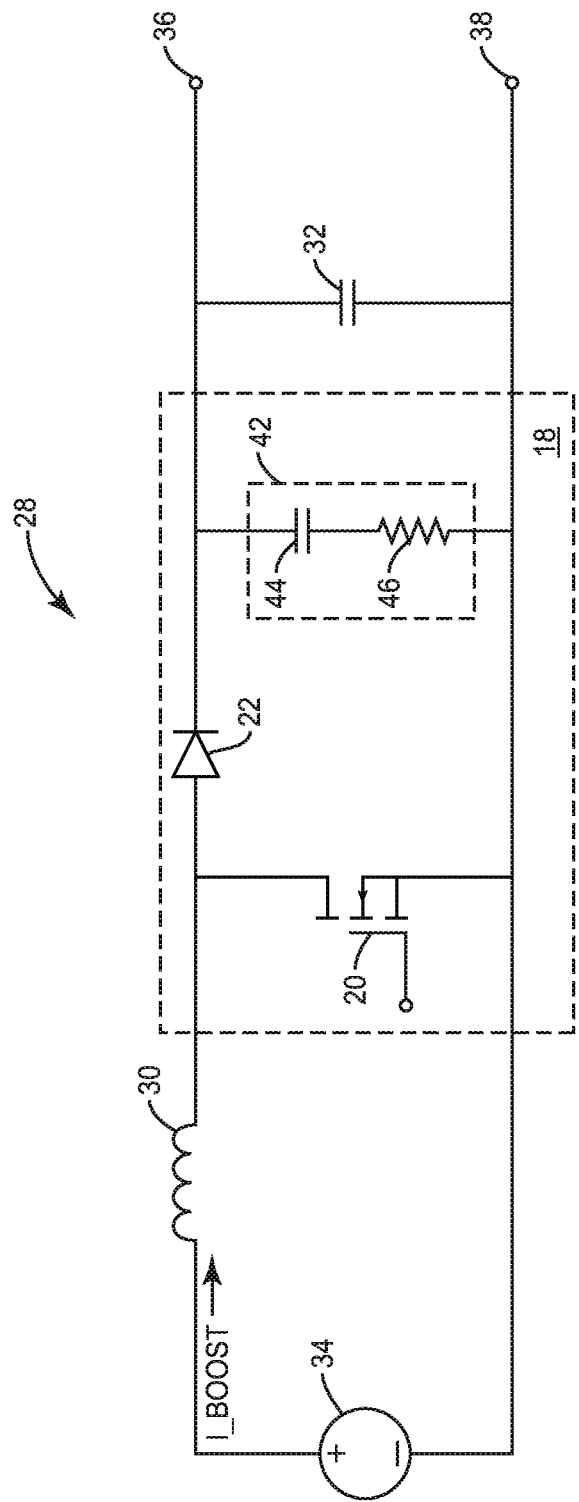
FIG. 6 is a schematic of a boost converter including power converter circuitry according to an additional embodiment of the present disclosure.

FIG. 6 shows the boost converter circuitry 28 according to an additional embodiment of the present disclosure. The boost converter circuitry shown in FIG. 6 is substantially similar to that shown in FIG. 4, except that the boost converter circuitry 28 shown in FIG. 6 includes snubber circuitry 42 coupled between the first load output 36 and the second load output 38. The snubber circuitry 42 includes a snubber capacitor 44 and a snubber resistor 46 coupled in series between the first load output 36 and the second load output 38. As discussed above, the snubber capacitor 44 and the snubber resistor 46 may be within the power converter circuitry 18 in order to reduce the length of the snubber loop between the cathode of the first diode 22 and the source contact (S) of the first MOSFET 20. The snubber circuitry 42 effectively reduces transient signals, occurring at the cathode of the first diode 22. Specifically, ringing occurring due to swings in the current provided at the cathode of the first diode 22 may be significantly reduced by the snubber circuitry 42. Reducing this ringing prevents output overshoots and undershoots, thus increasing the reliability and performance of the boost converter circuitry 28 primarily by lowering radiated and conducted EMI.

Figure 7:
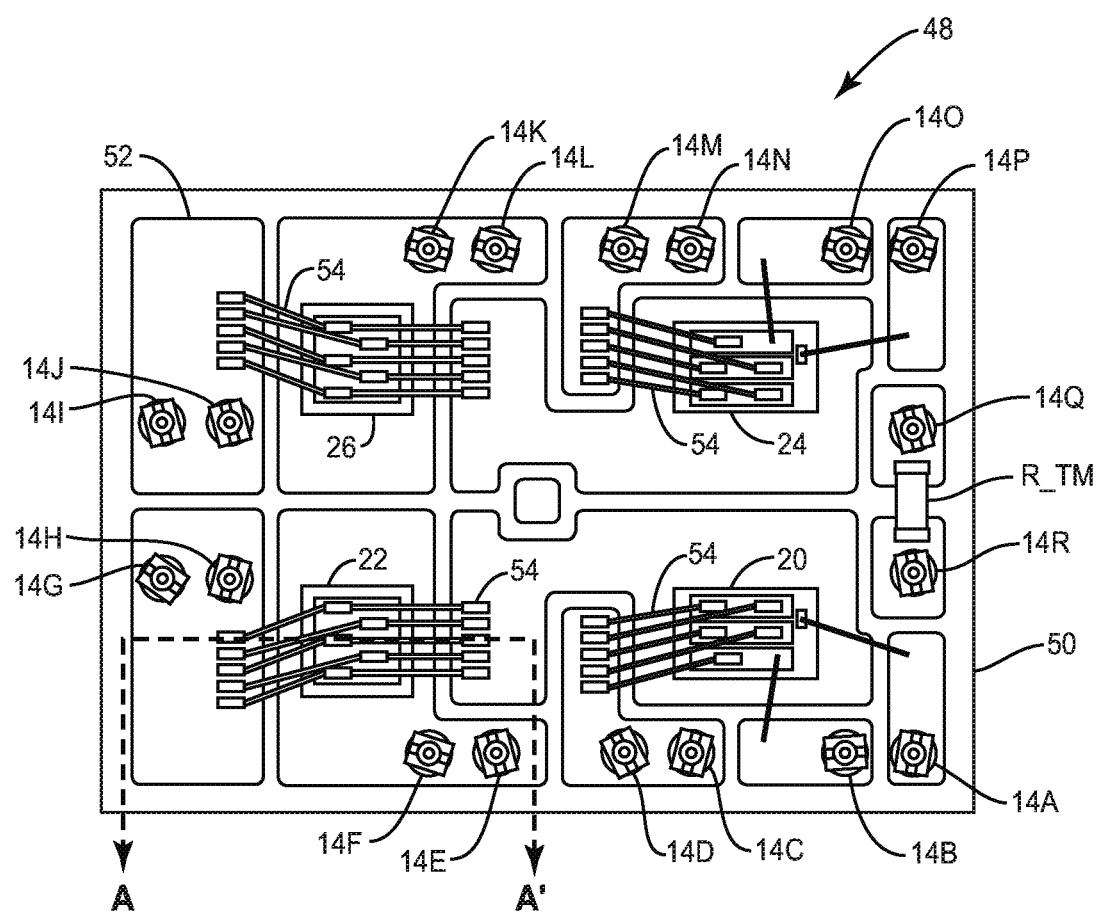
FIG. 7 is a top view of power converter circuitry according to one embodiment of the present disclosure.

FIG. 7 shows a top view of a substrate 48 within the housing 12 according to one embodiment of the present disclosure. Notably, the substrate 48 may be an active metal braze (AMB) substrate including an insulating aluminum nitride base layer 50 and a first conductive layer 52 on a first surface of the aluminum nitride base layer 50. As discussed herein, an active metal braze (AMB) substrate is a substrate in which conductive layers applied to a base layer have been brazed in a high temperature vacuum brazing process in order to form a strong bond between the conductive layers and the insulating base layer. In general, AMB substrates are stronger than their conventional counterparts formed from technologies such as direct bond copper (DBC) and the like. Using an AMB substrate provides the necessary strength to the aluminum nitride base layer 50 to make it viable for use in the power converter module 10, which does not include a baseplate to increase the structural integrity thereof as in conventional designs. Aluminum nitride generally has far superior thermal conduction properties when compared to conventional substrate materials such as aluminum oxide. The increased thermal conductivity afforded by the use of the aluminum nitride base layer 50 allows for the switching components in the power converter module 10 to operate at lower temperatures, which may translate into higher power levels, higher efficiency, higher reliability, or all three.

In other embodiments, the substrate 48 is an active metal braze (AMB) substrate including an insulating silicon nitride base layer 50 and a first conductive layer 52 on a first surface of the silicon nitride base layer 50. Silicon nitride may have similar properties to aluminum nitride as discussed above and therefore may increase the performance of the power converter module 10. In another embodiment, the substrate 48 may be a DBC substrate including an aluminum nitride or silicon nitride base layer, which may allow for similar performance improvements to those discussed above.

The first conductive layer 52 is etched to form a desired pattern on the first surface of the aluminum nitride base layer 50. Wirebonds 54 connect the first MOSFET 20, the first diode 22, the second MOSFET 24, and the second diode 26 to various parts of the first conductive layer 52 in order to connect the various components as described above with respect to FIG. 3. The particular pattern of the first conductive layer 52 is chosen in order to minimize the distance from the gate contact (G) of each one of the first MOSFET 20 and the second MOSFET 24 to their respective I/O pins 14, minimize the length of the wirebonds 54, and optimize current flow through the power converter module 10. In one embodiment, the pattern of the first conductive layer 52 and routing of wirebonds 54 are designed such that the power switching path has a maximum length of about 50 mm and the gate control path has a maximum length of about 20 mm. As defined herein, the gate control path is the total distance (as determined by tracing the path) between I/O pin 14O (shown in FIG. 3) and I/O pin 14P (also shown in FIG. 3). Further as defined herein, the power switching path is the total distance (as determined by tracing the path) between I/O pin 14E and I/O pin 14F to I/O pin 14C and I/O pin 14D (all shown in FIG. 3). Minimizing the power switching path length and gate control path length reduces the stray inductance in the power converter module 10, which may be less than 15 nH according to some embodiments. In one embodiment, wirebonds 54 in the gate control path have a diameter of ~5 mil, while wirebonds 54 in the power switching path have a diameter ~15 mil. More or less wirebonds 54 may be used to form a particular leg of the particular conduction path based on a desired current carrying capacity thereof.

Figure 8:
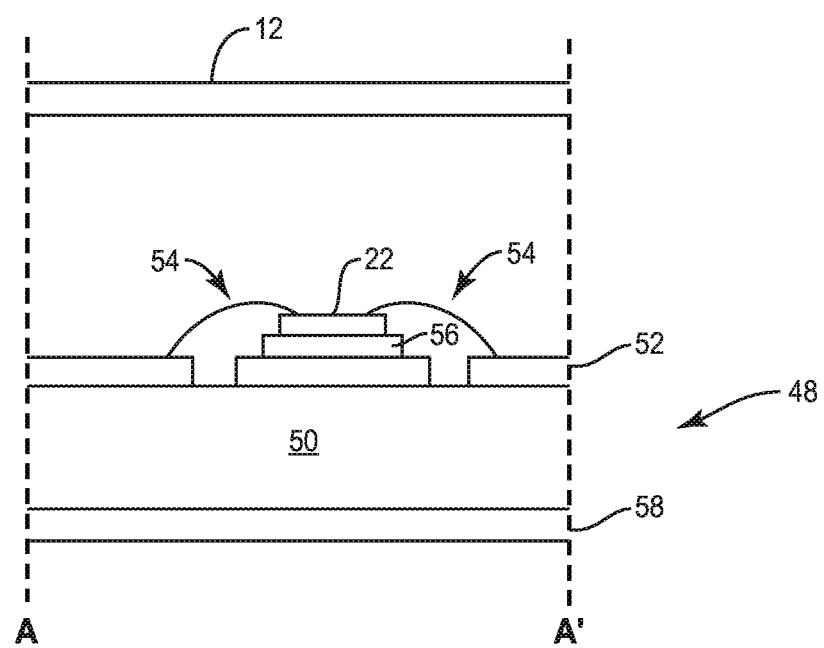
FIG. 8 is a cross-sectional view of a substrate and the power converter circuitry shown in FIG. 3 according to one embodiment of the present disclosure.

FIG. 8 shows a cross-sectional view of the housing 12 and the substrate 48 through line A-A' shown in FIG. 7. As shown in FIG. 8, the substrate 48 is mounted in the housing 12 and includes the aluminum nitride base layer 50, the first conductive layer 52 on which the first diode 22 is attached via a die attach material 56 and connected via the wirebonds 54, and a second conductive layer 58. In some embodiments, the space between the substrate 48 and the housing 12 is filled with an inert gel. Notably, as discussed above, the power converter module 10 does not include a baseplate. Accordingly, the substrate 48 must be adequately rugged in order to support the power converter circuitry 18 formed on the first conductive layer 52. Further, as silicon carbide devices are generally high power density devices that produce a significant amount of heat, it is desirable for the substrate 48 to have a relatively low thermal resistance such that the substrate 48 is capable of efficiently dissipating heat. Using an AMB substrate as discussed above provides a strong substrate 48 that is capable of efficiently dissipating heat. In one embodiment, the insulating base layer 50 may have a minimum thermal conductivity of 30 W/m-K in order to provide low thermal resistance between the power converter circuitry 18 and the second conductive layer 58. Accordingly, the power converter circuitry 18 may be operated in order to provide additional power output, additional efficiency, or both.

Those skilled in the art will recognize improvements and modifications to the preferred embodiments of the present disclosure. All such improvements and modifications are considered within the scope of the concepts disclosed herein and the claims that follow.

What is claimed is:

1. A power converter module comprising:
   a substrate; and
   power converter circuitry on the substrate, the power converter circuitry comprising a plurality of switching components coupled together via a conductive layer on the substrate and configured to selectively deliver power to a load,
   wherein a stray inductance of the power converter circuitry is less than 15 nH; and
   wherein the power converter circuitry is configured as boost converter circuitry.

2. The power converter module of claim 1 wherein:
   wherein the power converter circuitry is divided into two parts that each comprise a channel;
   the plurality of switching components are implemented with a gate control path and a power switching path; and
   a length of the gate control path and a length of the power switching path are implemented such that the stray inductance of the power converter circuitry is less than 15 nH.

3. The power converter module of claim 2
   wherein a length of the power switching path is less than 50 mm; and
   wherein the power converter circuitry comprises a two-channel boost converter.

4. The power converter module of claim 3 wherein the length of the gate control path is less than 20 mm.

5. The power converter module of claim 4 wherein:
   the conductive layer of the substrate is etched to form a connection pattern between the plurality of switching components; and
   the plurality of switching components are coupled to parts of the connection pattern of the conductive layer and the plurality of switching components are further coupled to other parts of the connection pattern via one or more wirebonds.

6. The power converter module of claim 2 wherein the length of the gate control path is less than 20 mm.

7. The power converter module of claim 1 further comprising snubber circuitry coupled to at least one of the plurality of switching components,
   wherein the plurality of switching components comprises silicon carbide semiconductor components.

8. The power converter module of claim 1 wherein the power converter circuitry is configured to provide an output voltage greater than 650V and an output power greater than 900 W, and operate at a switching frequency greater than 40 kHz.

9. A power converter module comprising:
   at least one metal-oxide semiconductor field-effect transistor (MOSFET) including a drain contact, a gate contact, and a source contact;
   at least one diode including an anode coupled to the drain contact of the at least one MOSFET and a cathode; and
   snubber circuitry coupled between the cathode of the at least one diode and the source contact of the at least one MOSFET,
   wherein the at least one MOSFET and the at least one diode are configured as boost converter circuitry.

10. The power converter module of claim 9
    wherein the at least one diode is external to the at least one MOSFET; and
    wherein the boost converter circuitry is connected to a boost inductor.

11. The power converter module of claim 9
    wherein the snubber circuitry is configured to reduce transient signals at the cathode of the at least one diode; and
    wherein the boost converter circuitry is divided into two parts that each comprise a channel.

12. The power converter module of claim 11 wherein the snubber circuitry comprises a snubber capacitor coupled in series with a snubber resistor.

13. The power converter module of claim 9 wherein the snubber circuitry comprises a snubber capacitor coupled in series with a snubber resistor.

14. The power converter module of claim 9 wherein the power converter module is configured to provide an output voltage greater than 650V and an output power greater than 900 W, and operate at a switching frequency greater than 40 kHz.

15. The power converter module of claim 9 wherein the at least one MOSFET is a silicon carbide MOSFET.

16. The power converter module of claim 15 wherein the at least one diode is a silicon carbide diode.

17. A power converter module comprising:
    a substrate;
    at least one metal-oxide semiconductor field-effect transistor (MOSFET) provided on the substrate, the at least one MOSFET including a drain contact, a gate contact, and a source contact;
    at least one diode provided on the substrate in series with the at least one MOSFET and including an anode coupled to the drain contact of the at least one MOSFET; and
    an inner-loop capacitor provided on the substrate and coupled between a cathode of the at least one diode and the source contact of the at least one MOSFET,
    wherein the at least one MOSFET and the at least one diode are configured as boost converter circuitry.

18. The power converter module of claim 17
    wherein the at least one diode is configured and arranged external to the at least one MOSFET; and
    wherein the boost converter circuitry is connected to a boost inductor.

19. The power converter module of claim 17 further comprising snubber circuitry coupled to the at least one MOSFET,
  wherein the inner-loop capacitor is configured to reduce parasitic inductance at the cathode of the at least one diode.

20. The power converter module of claim 19
  wherein the inner-loop capacitor is a high-frequency ceramic capacitor; and
  wherein the boost converter circuitry is connected to a boost inductor.

21. The power converter module of claim 17
  wherein the inner-loop capacitor is a high-frequency ceramic capacitor; and
  wherein the boost converter circuitry is connected to a boost inductor.

22. The power converter module of claim 17
  wherein the power converter module is configured to provide an output voltage greater than 650V and an output power greater than 900 W, and operate at a switching frequency greater than 40 kHz; and
  wherein the boost converter circuitry comprises a two-channel boost converter.

* * * * *